(12) United States Patent
Fischer et al.

(10) Patent No.: US 7,439,725 B2
(45) Date of Patent: Oct. 21, 2008

(54) MULTIMETER

(75) Inventors: Günter Fischer, Wendelstein (DE); Dietmar Koops, Wendelstein (DE)

(73) Assignee: GMC-I Gossen- Metrawatt GmbH, Nuernberg (DE)

( * ) Notice: Subject to any disclaimer, the term of this patent is extended or adjusted under 35 U.S.C. 154(b) by 0 days.

(21) Appl. No.: 11/645,833

(22) Filed: Dec. 26, 2006

(65) Prior Publication Data

US 2007/0159158 A1 Jul. 12, 2007

(30) Foreign Application Priority Data

Dec. 23, 2005 (DE) .................... 10 2005 062 624

(51) Int. Cl.
*G01R 15/08* (2006.01)
(52) U.S. Cl. .................... 324/115; 324/99 D; 324/156
(58) Field of Classification Search .................. None
See application file for complete search history.

(56) References Cited

U.S. PATENT DOCUMENTS 5,166,599 A   11/1992   Hochreuther et al.
5,243,275 A * 9/1993   Nakazawa et al. .......... 324/110
5,442,337 A   8/1995   Hwang
5,619,129 A * 4/1997   Kamiya ...................... 324/115

FOREIGN PATENT DOCUMENTS

EP    0 474 086 A2   3/1992
JP    62-39333      8/1994

* cited by examiner

*Primary Examiner*—Minh N Tang
(74) *Attorney, Agent, or Firm*—Laurence A. Greenberg; Werner H. Stemer; Ralph E. Locher

(57) ABSTRACT

A multimeter has a housing with at least three input connections, configured as female connectors, for connecting to two measurement lines. When a measurement variable is changed, it is possible to connect at least one of the measurement lines to another input connection. The multimeter has a measurement-range switch which can be moved to a switching position associated with the selected measurement variables, and a mechanical blocking apparatus coupled to the switch. The blocking apparatus allows specific input connections to be blocked such that contact can be made only with the input connections which have an associated measurement variable which corresponds to the measurement variable set by the switch. The blocking apparatus is formed as a pivotable angle lever, and the switch moves end regions of strip-shaped angle limbs of the angle lever to a position aligned with the input connections to be blocked.

15 Claims, 9 Drawing Sheets

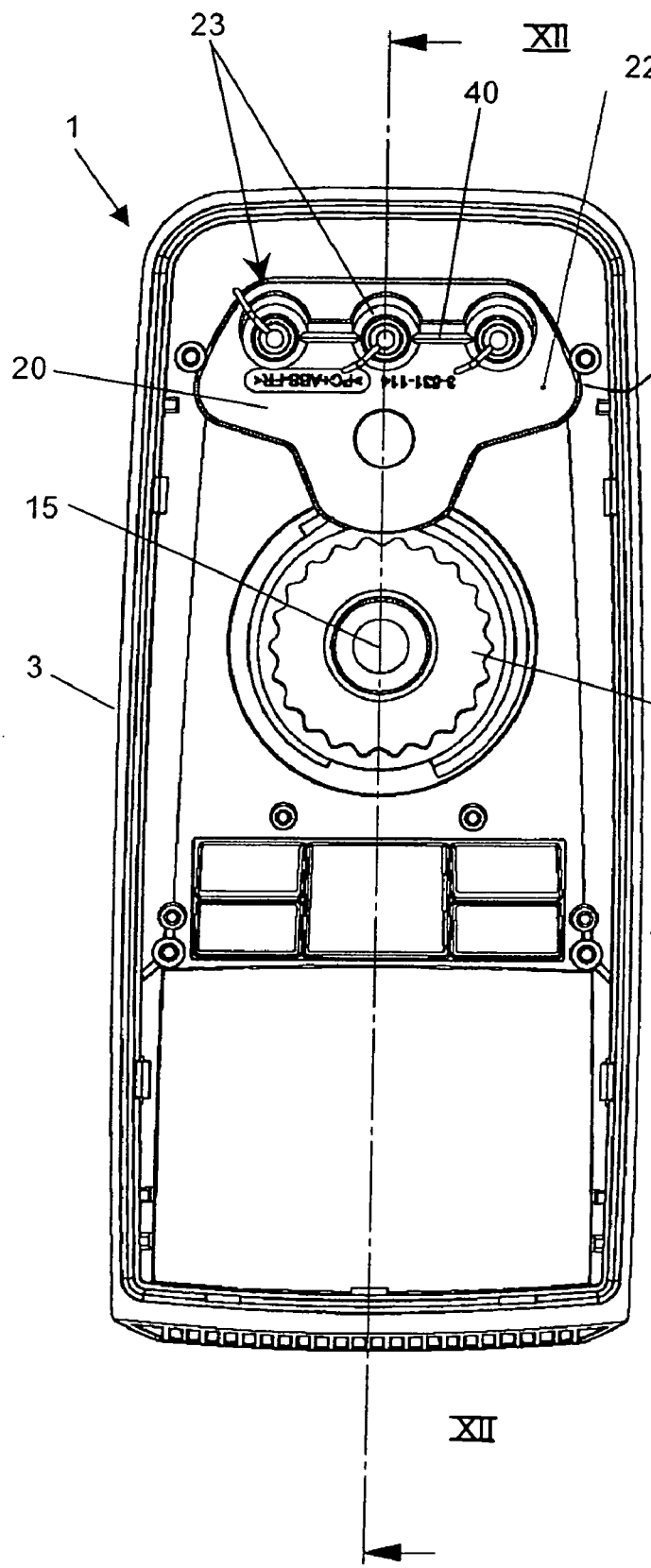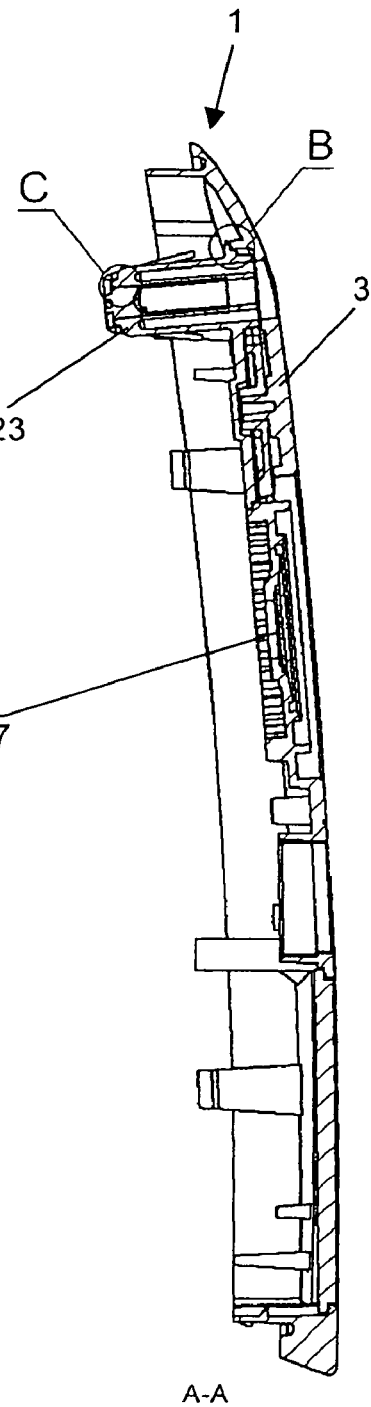
Fig. 11
Fig. 12

B

C

MULTIMETER

CROSS-REFERENCE TO RELATED APPLICATION

This application claims the priority, under 35 U.S.C. §119, of German application DE 10 2005 062 624.6, filed Dec. 23, 2005; the prior application is herewith incorporated by reference in its entirety.

BACKGROUND OF THE INVENTION

Field of the Invention

The invention relates to a multimeter with a housing which has at least three input connections, which are configured as female connectors, for the connection of two measurement lines. When a measurement variable to be investigated is changed, it is possible to connect at least one of the measurement lines to another input connection which is associated with the new measurement variable.

A multimeter of this type is known from European patent EP 0 474 086 B1. The known multimeter is distinguished in that it has a measurement-range switch which can be moved to a switching position which is associated with the selected measured variables. The multimeter further has a mechanical blocking apparatus coupled to the measurement-range switch, which blocking apparatus allows specific input connections to be blocked in such a way that contact, which carries a measurement signal via the measurement lines, can be made only with the input connections which have an associated measurement variable which corresponds to the measurement variable set by the measurement-range switch. In this prior art, the blocking apparatus is a plate-like blocking gate which is matched to the type and configuration of the associated measurement-range switch and in which a cutout is provided whose positioning corresponds to the switching position of the measurement-range switch such that the cutout in each case unblocks the receiving channel of the input connection which is in the form of a female connector and is associated with the measurement variable set by the measurement-range switch.

Furthermore, Japanese utility model SHO 62-39333 discloses a test device in which the blocking apparatus is in the form of a linear slide which senses a gate of the measurement-range switch with one end region and with its other end blocks or unblocks an input connection, depending on the position of the slide.

SUMMARY OF THE INVENTION

It is accordingly an object of the invention to provide a multimeter that overcomes the above-mentioned disadvantages of the prior art devices of this general type, which has a blocking apparatus that is simplified and in particular reduced in size but nevertheless can be used to block a plurality of input connections.

With the foregoing and other objects in view there is provided, in accordance with the invention, a multimeter. The multimeter contains a housing having at least three input connections, being female connectors for connecting to two measurement lines. When a new measurement variable is to be measured, it is possible to connect at least one of the measurement lines to another one of the input connections associated with the new measurement variable. A measurement-range switch is moved to a switching position associated with selected measurement variables, the measurement-range switch is supported by the housing. A mechanical blocking apparatus is coupled to the measurement-range switch. The blocking apparatus allows specific ones of the input connections to be blocked such that contact, which carries a measurement signal via the measurement lines, can be made only with the input connections having an associated measurement variable corresponding to the measurement variable set by the measurement-range switch. The blocking apparatus has an apex and a pivotable angle lever mounted substantially at the apex. The angle lever has strip-shaped angle limbs with end regions. The measurement-range switch moves the end regions of the strip-shaped angle limbs to a position aligned with a respective one of the input connections to be blocked. A connector housing being an encapsulated, water-tight connector housing is provided. The blocking apparatus is disposed in the water-tight connector housing.

The invention is characterized in that the blocking apparatus is formed in the manner of a pivotable angle lever which is mounted at its apex, and it is possible to use the measurement-range switch to move the end regions of the strip-shaped angle limbs to a position aligned with the input connections to be closed. Such an embodiment of the blocking apparatus can be produced in a manner which is simple and cost-effective in terms of material, and it can be easily assembled and takes up only relatively little space within the housing since the free region available between the two limbs can be utilized to dispose an input connection which must not be closed by the two end regions of the angle limbs, in particular a "COM" connection of the multimeter.

According to one development of the invention, a switching projection which engages with an adjustment element of the measurement-range switch is disposed on the angle lever. The angle lever being formed symmetrically in relation to the switching projection and a three-pointed star being formed by the two limbs and the switching projection. A part like this is likewise easy to produce and easy to mount. Particularly compact conditions are produced within the multimeter housing in terms of the arrangement of the blocking gate when the opening in the central input connection, the bearing point of the angle lever and the center of rotation of the measurement-range switch lie in one line. Secure and stable engagement between the switching projection and the measurement-range switch results when the switching projection is coupled to the rotatable measurement-range switch in an interlocking manner in two ways, specifically first by a nib which engages in a driver recess in the rotatable measurement-range switch, and by a groove which surrounds a driver projection which is disposed in the driver recess in the measurement-range switch.

It is particularly advantageous when the blocking apparatus is disposed in a housing which is encapsulated in a water-tight manner. The multimeter then also satisfies relatively stringent requirements for water-tightness, which are particularly advantageous with regard to the operational reliability of the device, despite the provision of a blocking-gate arrangement. The housing of the blocking apparatus is formed by a side wall, which laterally surrounds the blocking apparatus, and a connector-support wall which virtually forms an intermediate wall and on which contact bushings which are aligned with the input connections are integrally arranged, with the contacts of the connectors being welded into the contact bushings. The passage of the lines which are conducted in the interior of the multimeter housing is configured to be water-tight in this case. The connector-support wall is welded to the side wall of the housing; on account of the connector-support wall being secured, the bearing of the blocking gate is at the same time prevented from pivoting.

Reinforcing elements are provided in the region of the angle lever, which reinforcing elements allow the blocking gate to be subjected to a particularly high load.

The contact bushings are disposed in series and connected to one another by a reinforcement device. The reinforcement device is disposed between the contact bushings and merges with the connector-support wall. These features ensure that the housing of the blocking apparatus which is encapsulated in a water-tight manner is stable, even when relatively high mechanical shear forces are exerted on the multimeter by contact plugs of measurement lines being inserted.

Other features which are considered as characteristic for the invention are set forth in the appended claims.

Although the invention is illustrated and described herein as embodied in a multimeter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 11 is a diagrammatic, plan view of the multimeter with the connector-support wall mounted;

FIG. 12 is a diagrammatic, sectional view taken along the line XII-XII shown in FIG. 11;

DESCRIPTION OF THE PREFERRED EMBODIMENTS

Figure 1:
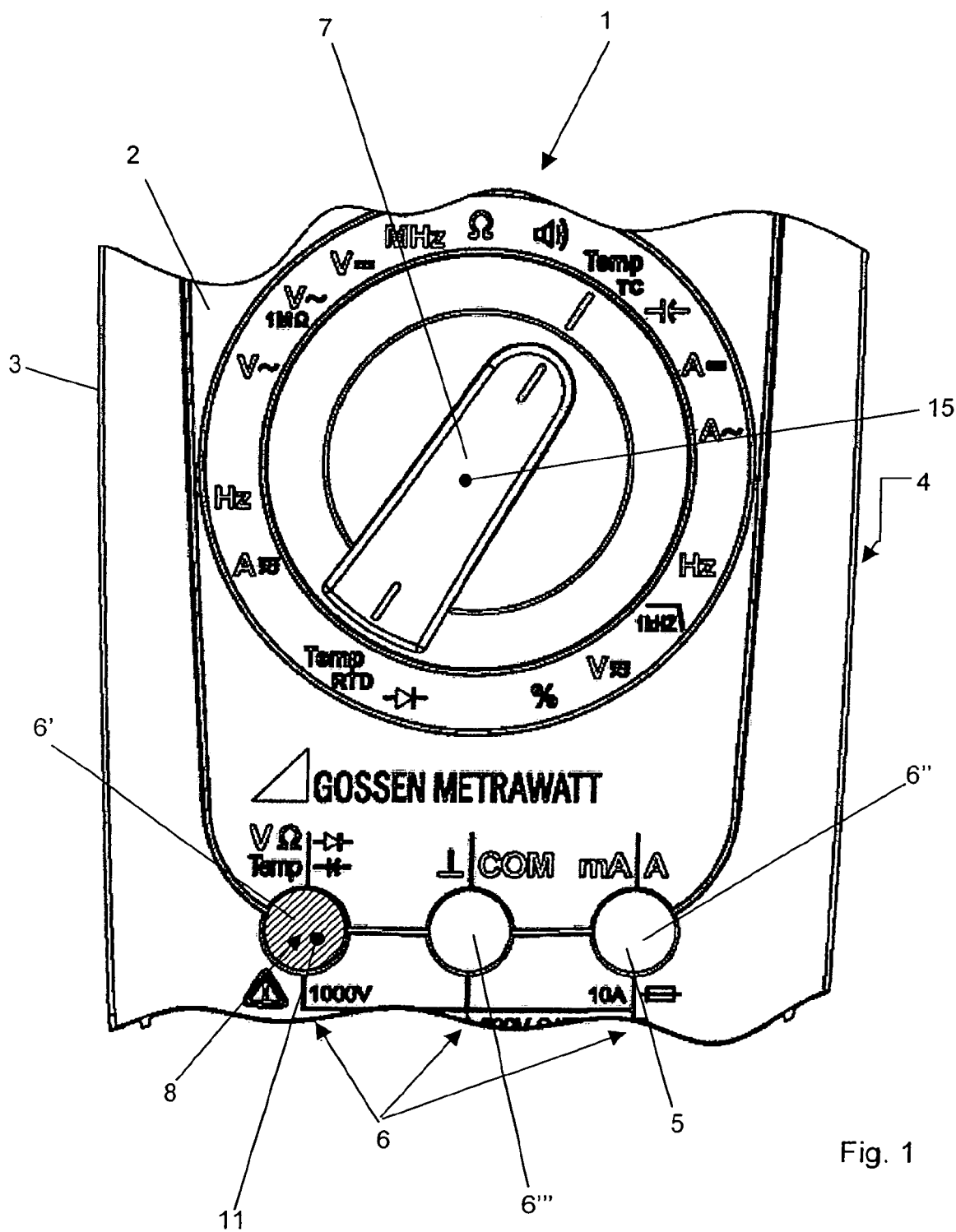
FIG. 1 is a diagrammatric, partial front elevational view of a multimeter with three input connections, of which the two outer input connections can be blocked by a blocking apparatus according to the invention.
Figure 2:
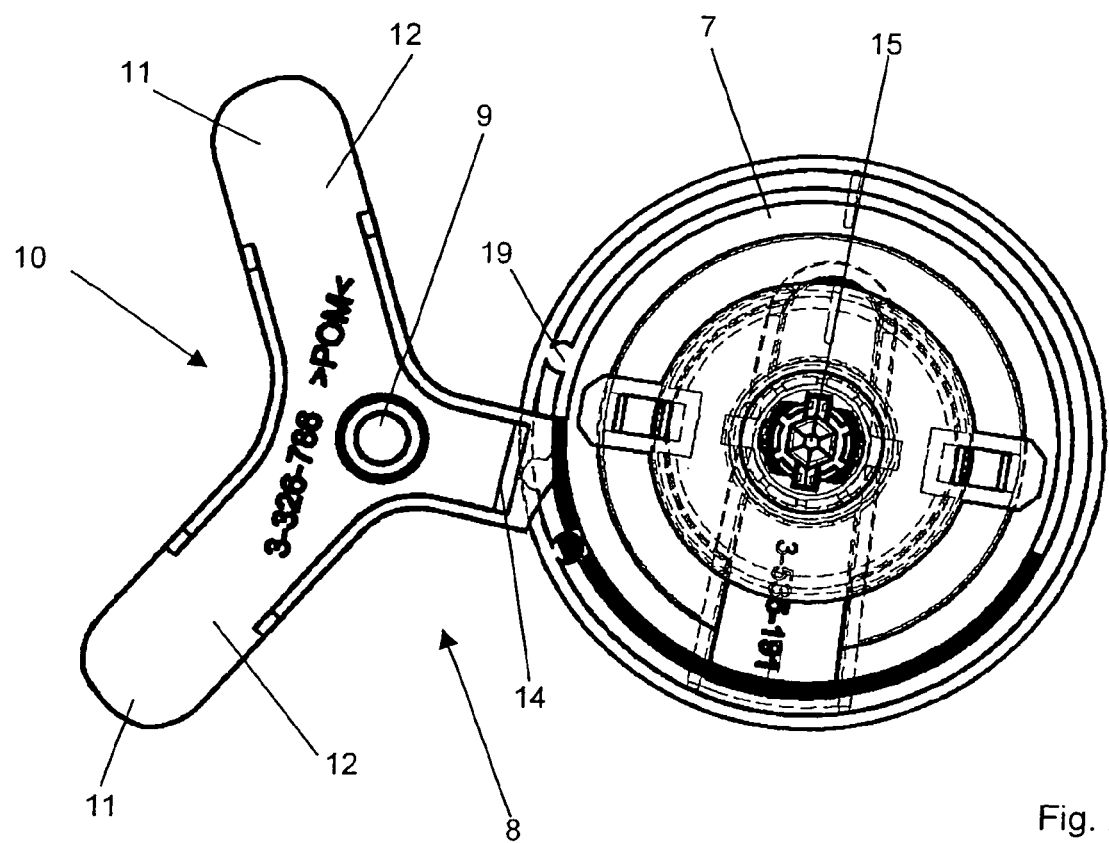
FIG. 2 is an internal view of an upper shell of a housing with the blocking apparatus which is in the form of a pivotable angle lever, with a measurement-range switch in a first switching position.
Figure 3:
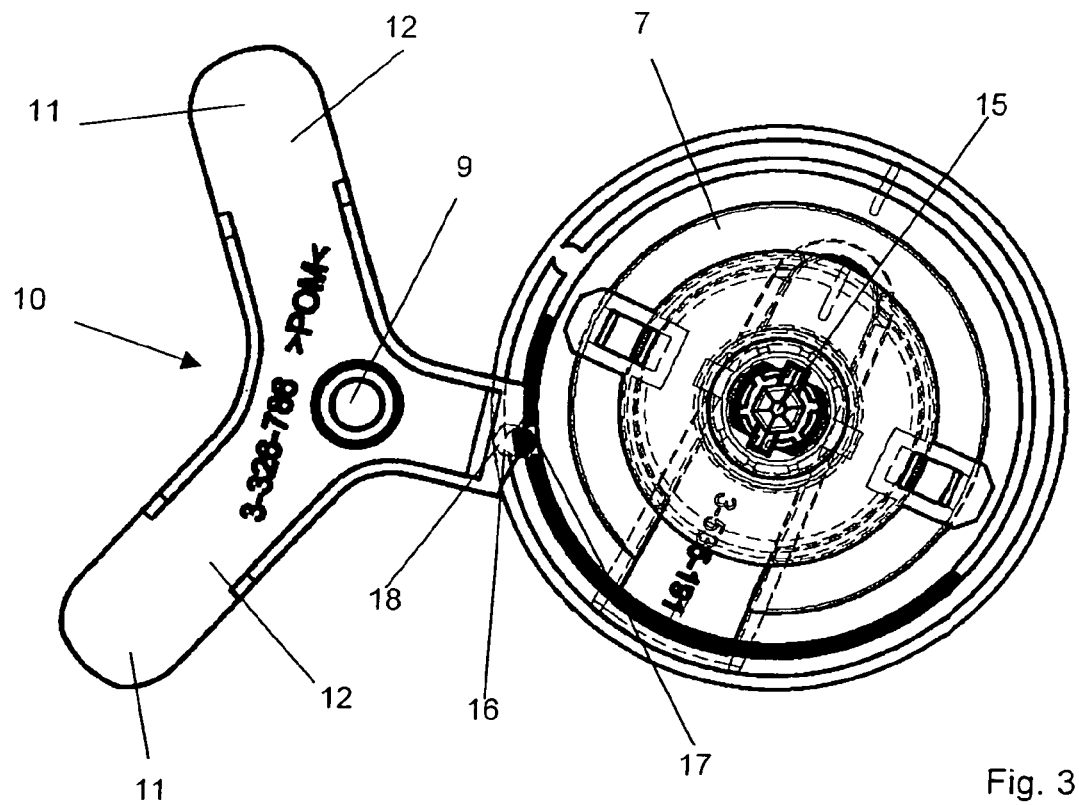
FIG. 3 is an internal view according to FIG. 2 with the measurement-range switch in a second switching position.
Figure 4:
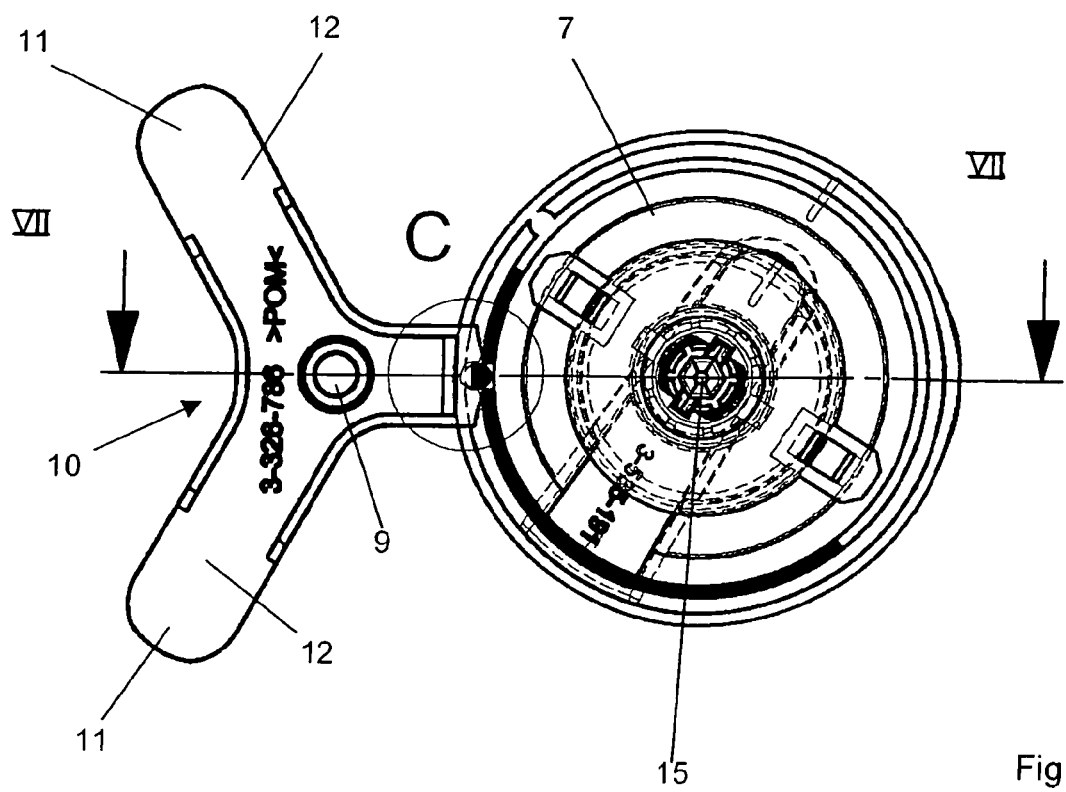
FIG. 4 is an internal view according to FIGS. 2 and 3 with the measurement-range switch in an intermediate position.
Figure 5:
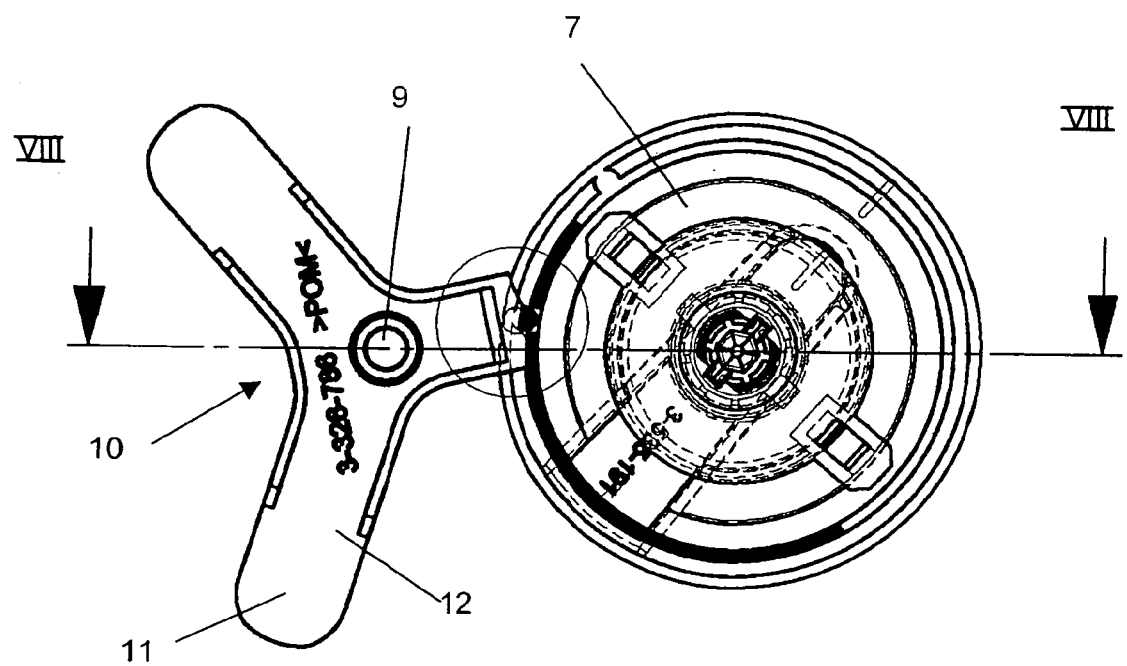
FIG. 5 is an internal view according to FIGS. 2-4 with the measurement-range switch in a third switching position.
Figure 6:
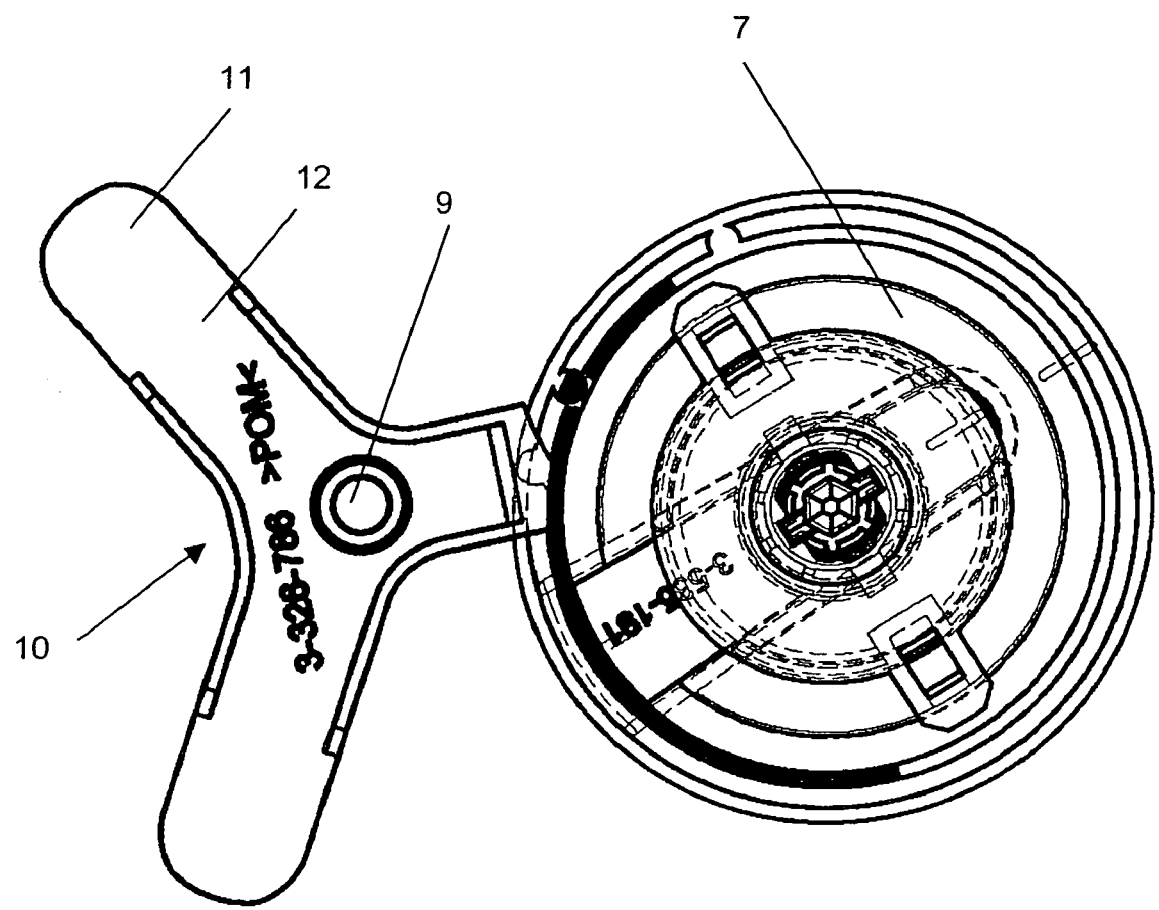
FIG. 6 is an internal view according to FIGS. 2-5 with the measurement-range switch in a fourth switching position.
Figure 7:
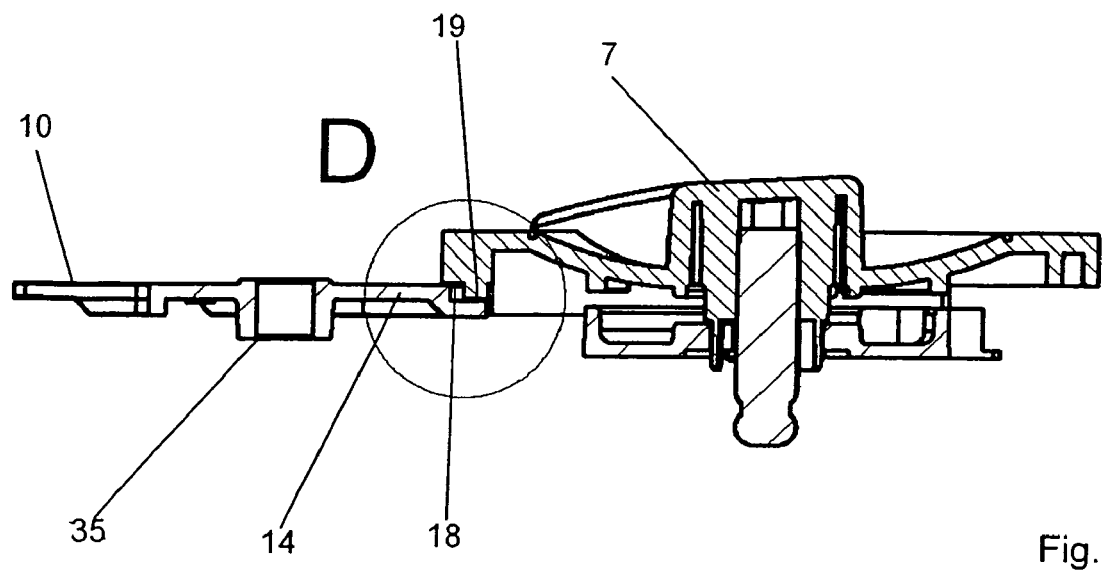
FIG. 7 is a diagrammatic, sectional view taken along the line VII-VII shown in FIG. 4.
Figure 8:
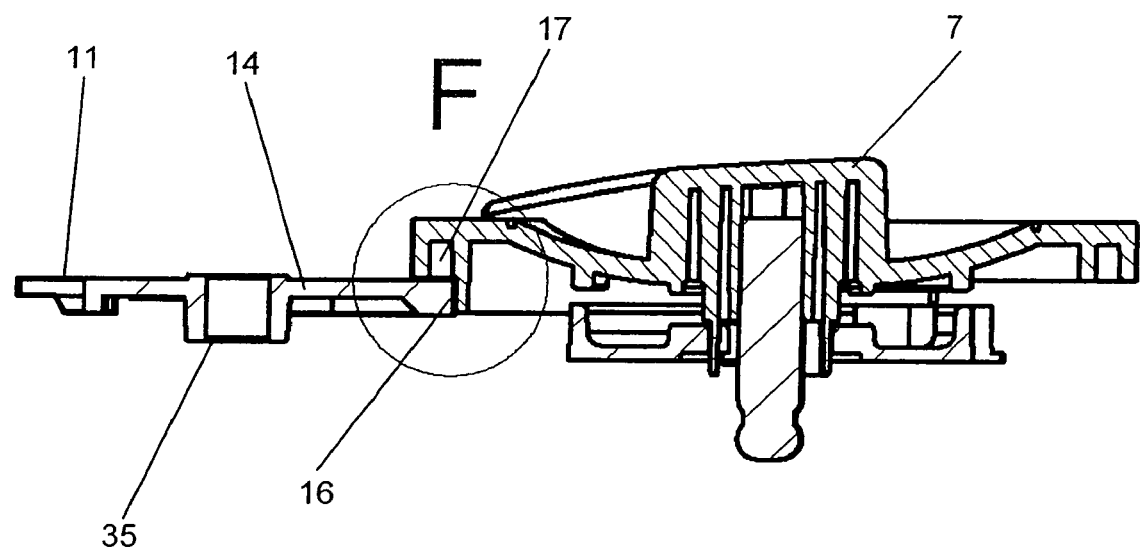
FIG. 8 is a diagrammatic, sectional view taken along the line VIII-VIII shown in FIG. 5.
Figure 9:
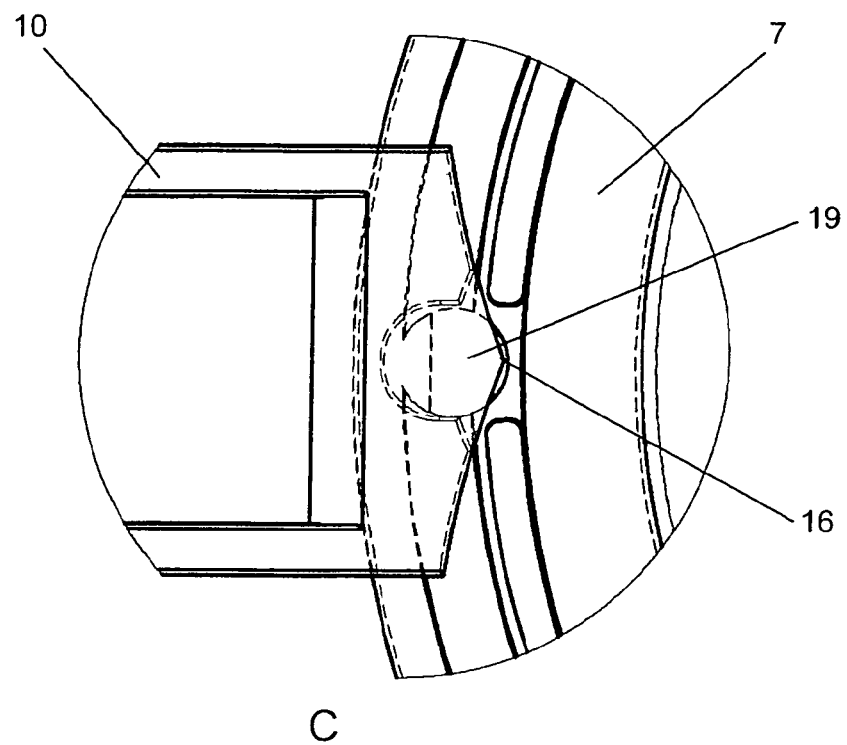
FIG. 9 is a detailed view of an interlocking engagement according to region C shown in FIG. 4.
Figure 10:
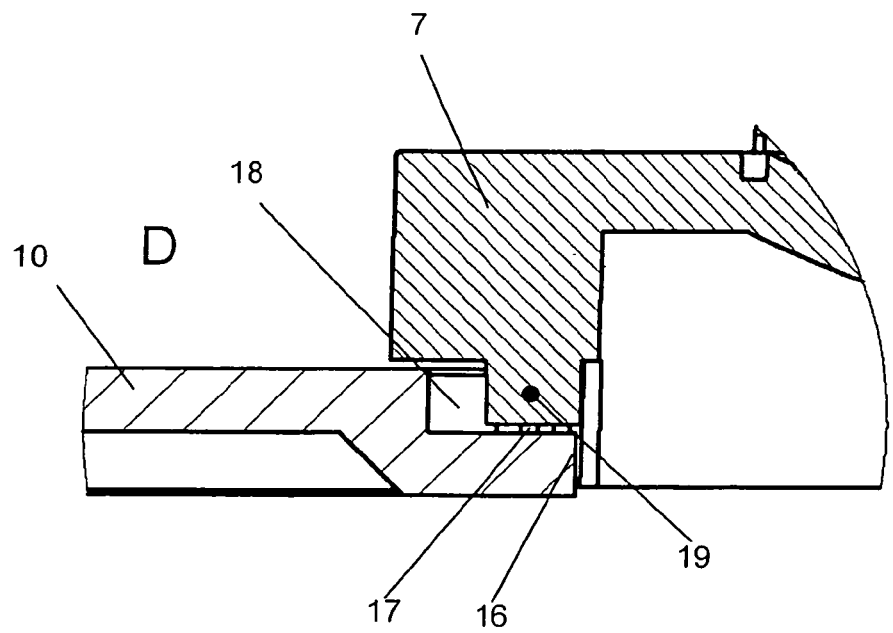
FIG. 10 is a detailed view of the interlocking connection according to region D shown in FIG. 7.
Figure 13:
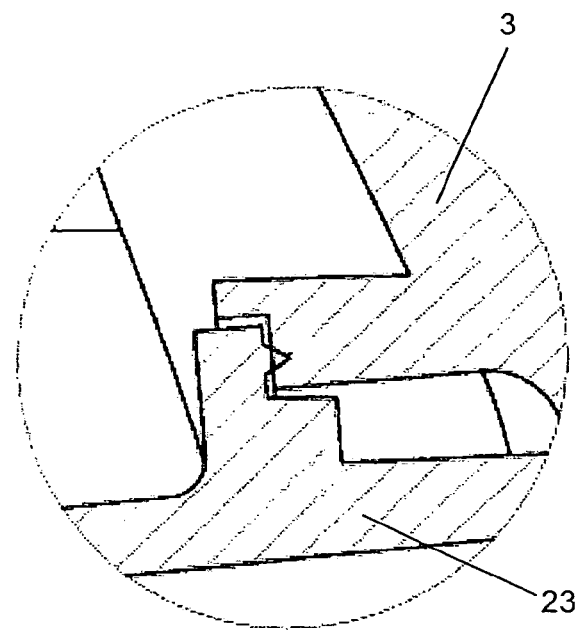
FIG. 13 is a sectional view of a seal of a connector-support wall according to detail B shown in FIG. 12.

Referring now to the figures of the drawing in detail and first, particularly, to FIG. 1 thereof, there is shown a multimeter 1 having a housing 2 which is composed of two housing shells 3, 4. The upper housing shell 3 is provided with three input connections 6, which are configured as female connectors 5, and are used for connecting to non-illustrated measurement lines. The upper housing shell 3 is provided with a measurement-range switch 7 which can be rotated to a switching position which is associated with the selected measurement variables. A mechanical blocking apparatus 8 is coupled to the measurement-range switch 7, which blocking apparatus 8 allows the two outer input connections 6', 6" to be blocked in such a way that the plug of a measurement line can be inserted only into a female connector 5 which corresponds to a measurement variable set by the measurement-range switch 7.

The blocking apparatus 8 is shown in detail in FIGS. 2-6, with different switching positions of the blocking apparatus 8, together with the measurement-range switch 7, being illustrated from the inside of the housing.

The blocking apparatus 8 is formed in the manner of a pivotable angle lever 10 which is mounted substantially at its apex 9, it being possible to use the measurement-range switch 7 to move end regions 11 of strip-shaped angle limbs 12 to a position aligned with the input connections 6', 6" to be closed. A switching projection 14 which can engage with an adjustment element 13 (FIG. 15) of the measurement-range switch 7 is arranged on the angle lever 10, with the angle lever 10 being formed symmetrically in relation to the switching projection 14 and a three-pointed star being formed by the two limbs 12 and the switching projection 14. The figures clearly show that the two angle limbs 12 of the angle lever 10 extend above the central input connection 6''', so that the central input connection 6''' cannot be closed by the end regions 11 of the angle limbs 12.

The measurement-range switch 7, the angle lever 10 and the central input connection 6''' are disposed such that the bearing point (apex 9) of the angle lever 10, the center of rotation 15 of the measurement-range switch 7 and the opening in the central input connection 6''' lie on a straight line.

The switching projection 14 has a nib 16 which engages in a driver recess 17 in the rotatable measurement-range switch 7. In addition, a groove 18, which surrounds a driver projection 19 which is arranged in the recess 17 of the measurement-range switch 7, is arranged in the region of the nib 16.

The elements 16-19, which form the interlocking connection and are required to adjust the blocking apparatus 8 following rotation of the measurement-range switch 7, are illustrated once again in detail in FIGS. 7-10.

Figure 14:
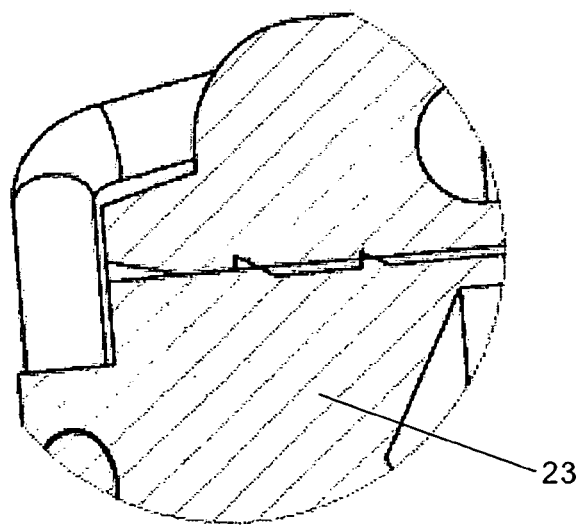
FIG. 14 is sectional view of a detail of the connector seal according to region C shown in FIG. 12.

As can be seen particularly from FIGS. 11-15, the blocking apparatus 8 is disposed in a connector housing 20 which is encapsulated in a water-tight manner, with the connector housing 20 being formed by a side wall 21, which laterally surrounds the blocking apparatus 8, and a connector-support wall 22 on which contact bushings 23 which are aligned with the input connections 6 are integrally formed. The contacts of the connectors 5 can be welded into the contact bushings 23, but it is also possible for the contacts to be sealed off by circumferential seals of the connectors with a double undercut, as shown in FIG. 14.

The connector-support wall 22 is ultrasonically welded and thus closely connected to the side wall 21 of the connector housing 20.

Figure 15:
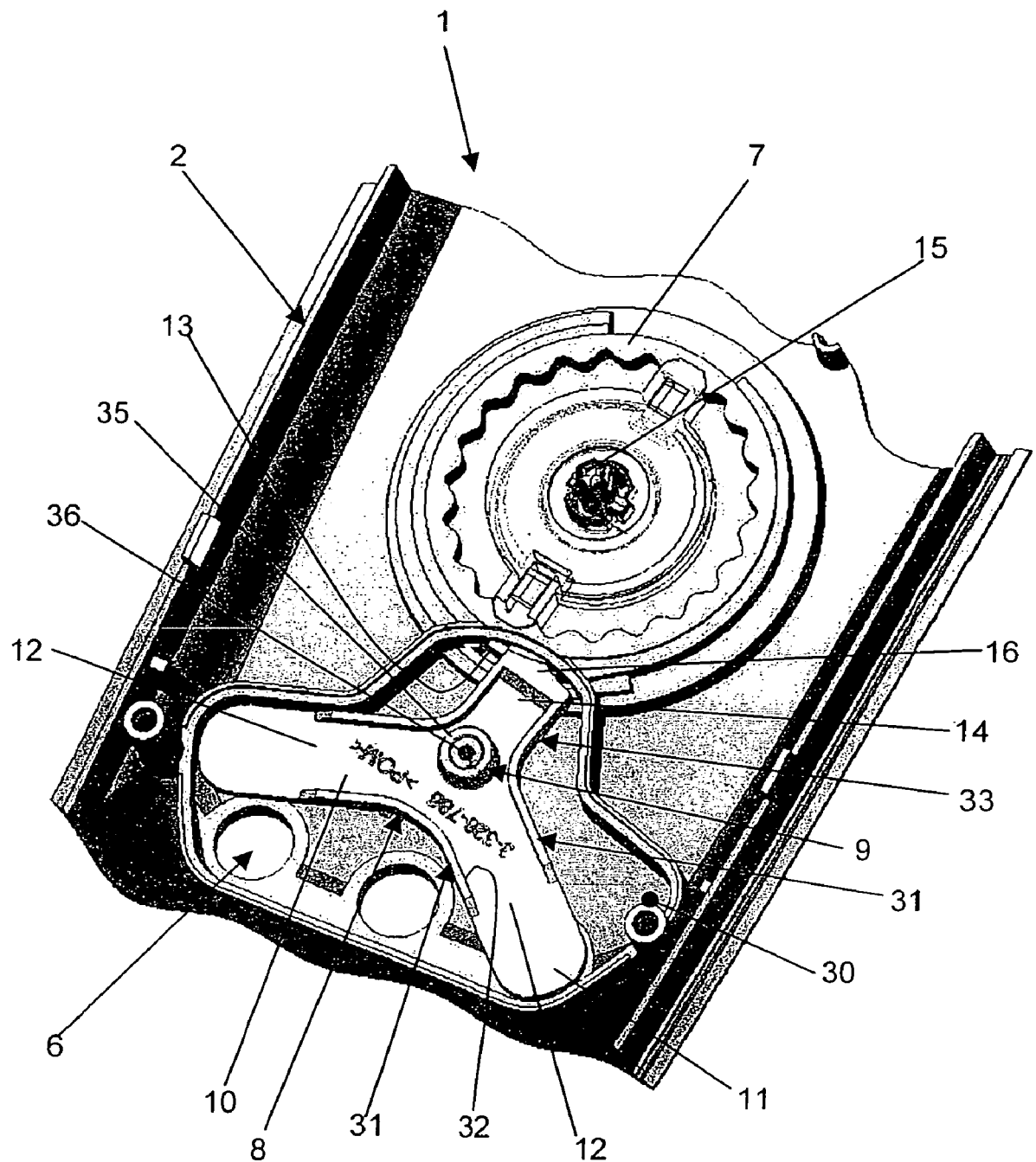
FIG. 15 is a diagrammatic, perspective view of the blocking apparatus which is inserted into the side walls, without a connector-support wall fitted.

The end regions 11 of the angle limbs 12 can be pivoted into side regions 30 of the connector housing 20, which side regions are arranged above the input connections 6', 6" which can be blocked by the blocking apparatus 8. This is shown in FIG. 15 in particular.

Reinforcing ribs 32 are disposed on side edges 31 of the angle lever 10, the reinforcing ribs continuing in side edges 33 of the switching projection 14.

The angle lever 10 surrounds a pivot-bearing projection 36 with a bushing-like bearing element 35, with the pivot-bearing element being mounted in a recess in the connector-support wall 22.

FIG. 11 further shows that the contact bushings 23 which are arranged in series are connected to one another by a rib-like reinforcement device 40 which is disposed between the contact bushings 23 and merges with the connector-support wall 22.

We claim:

1. A multimeter, comprising:
   a housing having at least three input connections, being female connectors for connecting to two measurement lines, and when a new measurement variable is to be measured, it is possible to connect at least one of the measurement lines to another one of said input connections being associated with the new measurement variable;
   a measurement-range switch being moved to a switching position associated with selected measurement variables, said measurement-range switch being supported by said housing;
   a mechanical blocking apparatus coupled to said measurement-range switch, said blocking apparatus allowing specific ones of said input connections to be blocked such that contact, which carries a measurement signal via the measurement lines, is made only with said input connections having an associated measurement variable corresponding to the measurement variable set by said measurement-range switch, said blocking apparatus having an apex and a pivotable angle lever mounted substantially at said apex, said angle lever having strip-shaped angle limbs with end regions, said measurement-range switch moving said end regions of said strip-shaped angle limbs to a position aligned with a respective one of said input connections to be blocked;
   a connector housing being an encapsulated, water-tight connector housing, said blocking apparatus disposed in said connector housing, said connector housing having side walls laterally surrounding said blocking apparatus and a connector-support wall; and
   said connector-support wall being closely connected to said side walls of said connector housing.

2. The multimeter according to claim 1, wherein:
   said measurement-range switch has an adjustment element; and
   said blocking apparatus has a switching projection for engaging with said adjustment element of said measurement-range switch, said switching projection disposed on said angle lever.

3. The multimeter according to claim 2, wherein said angle lever is formed symmetrically in relation to said switching projection, and a three-pointed star is formed by said strip-shaped angle limbs being two angle limbs and said switching projection.

4. The multimeter according to claim 2, wherein:
   said measurement range switch has a driver recess formed therein; and
   said switching projection has a nib engaging in said driver recess.

5. The multimeter according to claim 4, wherein:
   said measurement-range switch has a driver projection extending in said driver recess; and
   said nib has a groove formed therein and surrounding said driver projection.

6. The multimeter according to claim 2, wherein said angle lever has side edges and reinforcing ribs disposed on said side edges.

7. The multimeter according to claim 6, wherein said reinforcing ribs of said side edges of said angle lever continue in side edges of said switching projection.

8. The multimeter according to claim 1, wherein said strip-shaped angle limbs of said angle lever extend above a central input connection of said input connections.

9. The multimeter according to claim 8, wherein:
   said central input connection has an opening formed therein;
   said angle lever has a bearing point being said apex; and
   said measurement-range switch has a center of rotation, said opening, said bearing point and said center of rotation lie on a straight line.

10. The multimeter according to claim 1, wherein:
    said connector housing has side regions, said side regions are disposed above said input connections which are blocked by said blocking apparatus; and
    said end regions of said strip-shaped angle limbs can be pivoted into said side regions of said connector housing.

11. A multimeter, comprising:
    a housing having at least three input connections, being female connectors for connecting to two measurement lines, and when a new measurement variable is to be measured, it is possible to connect at least one of the measurement lines to another one of said input connections being associated with the new measurement variable;
    a measurement-range switch being moved to a switching position associated with selected measurement variables, said measurement-range switch being supported by said housing;
    a mechanical blocking apparatus coupled to said measurement-range switch, said blocking apparatus allowing specific ones of said input connections to be blocked such that contact, which carries a measurement signal via the measurement lines, is made only with said input connections having an associated measurement variable corresponding to the measurement variable set by said measurement-range switch, said blocking apparatus having an apex and a pivotable angle lever mounted substantially at said apex, said angle lever having strip-shaped angle limbs with end regions, said measurement-range switch moving said end regions of said strip-shaped angle limbs to a position aligned with a respective one of said input connections to be blocked;
    a connector housing being an encapsulated, water-tight connector housing, said blocking apparatus disposed in said connector housing;
    said connector housing having side walls laterally surrounding said blocking apparatus and a connector-support wall; and
    contact bushings being aligned with said input connections and being integrally disposed in said connector-support wall.

12. The multimeter according to claim 11, wherein said input connections are connectors having contacts, said contacts of said connectors being welded to said contact bushings.

13. The multimeter according to claim 11, wherein said connector-support wall is welded to said side walls of said connector housing.

14. The multimeter according to claim 11, wherein said connector-support wall has a recess formed therein;

further comprising a pivot-bearing projection with a bushing-like bearing element, said pivot-bearing projection being mounted in said recess in said connector-support wall; and wherein said angle lever surrounds said pivot-bearing projection with said bushing-like bearing element.

15. The multimeter according to claim 11, further comprising a reinforcement device, said contact bushings are disposed in series and connected to one another by said reinforcement device, said reinforcement device disposed between said contact bushings and merges with said connector-support wall.

* * * * *